United States Patent
Zheng et al.

(10) Patent No.: US 11,424,563 B2
(45) Date of Patent: Aug. 23, 2022

(54) BOARD-TO-BOARD CONNECTING STRUCTURE AND METHOD FOR MANUFACTURING THE SAME

(71) Applicants: Avary Holding (Shenzhen) Co., Limited., Shenzhen (CN); QING DING PRECISION ELECTRONICS (HUAIAN) CO., LTD, Huai an (CN); GARUDA TECHNOLOGY CO., LTD, New Taipei (TW)

(72) Inventors: Xiao-Feng Zheng, Shenzhen (CN); Xiao-Peng Rong, Shenzhen (CN)

(73) Assignees: Avary Holding (Shenzhen) Co., Limited., Shenzhen (CN); QING DING PRECISION ELECTRONICS (HUAIAN) CO.,LTD, Huai an (CN); GARUDA TECHNOLOGY CO., LTD, New Taipei (TW)

( * ) Notice: Subject to any disclaimer, the term of this patent is extended or adjusted under 35 U.S.C. 154(b) by 148 days.

(21) Appl. No.: 17/105,567

(22) Filed: Nov. 26, 2020

(65) Prior Publication Data
US 2022/0140508 A1 May 5, 2022

(30) Foreign Application Priority Data
Oct. 29, 2020 (CN) .......................... 202011183271.7

(51) Int. Cl.
H01R 13/40 (2006.01)
H01R 12/58 (2011.01)
H01R 12/52 (2011.01)
H01R 12/71 (2011.01)
H05K 3/30 (2006.01)

(52) U.S. Cl.
CPC ............ *H01R 12/585* (2013.01); *H01R 12/52* (2013.01); *H01R 12/716* (2013.01); *H05K 3/305* (2013.01); *H05K 2201/1059* (2013.01)

(58) Field of Classification Search
CPC .... H01R 12/52; H01R 12/585; H01R 12/716; H05K 3/303; H05K 3/305; H05K 2201/1059
USPC .................................................... 439/733.1
See application file for complete search history.

(56) References Cited

U.S. PATENT DOCUMENTS

| | | | |
|---|---|---|---|
| 5,515,604 A * | 5/1996 | Horine | H01R 12/52 29/830 |
| 2021/0307167 A1* | 9/2021 | Schimmoeller | H05K 1/111 |
| 2022/0140508 A1* | 5/2022 | Zheng | H01R 12/716 439/733.1 |

FOREIGN PATENT DOCUMENTS

CN 108028233 A 5/2018

* cited by examiner

*Primary Examiner* — Khiem M Nguyen
(74) *Attorney, Agent, or Firm* — ScienBiziP, P.C.

(57) ABSTRACT

A method for manufacturing a board-to-board connecting structure, including providing a first circuit board, including a first dielectric layer, a second dielectric layer stacked on the first dielectric layer, and a first wiring layer sandwiched between the first dielectric layer and the second dielectric layer. A second circuit board is provided, including a third dielectric layer, a fourth dielectric layers stacked on the third dielectric layer, and a second wiring layer sandwiched between the third dielectric layer and the fourth dielectric layer. The first step and the fourth dielectric layer are bonded through a first adhesive layer. The third step and the dielectric layer are bonded through a second adhesive layer. The second step and the fourth step are bonded through the conductive layer.

11 Claims, 6 Drawing Sheets

BOARD-TO-BOARD CONNECTING STRUCTURE AND METHOD FOR MANUFACTURING THE SAME

FIELD

The subject matter herein generally relates to circuit boards, and more particularly, to a board-to-board connecting structure and a method for manufacturing the board-to-board connecting structure.

BACKGROUND

Electronic devices, such as mobile phones, tablet computers, or personal digital assistants, may have more than one circuit board. To improve the performance of the electronic device, circuit boards with different functions may need to be connected together to form a board-to-board connecting structure.

The circuit boards may be connected together by connectors or golden fingers. However, such connecting structure may result in the board-to-board connecting structure having uneven thicknesses. Improvement in the art is desired.

BRIEF DESCRIPTION OF THE DRAWINGS

Implementations of the present technology will now be described, by way of embodiment, with reference to the attached figures.

DETAILED DESCRIPTION

Figure 1:
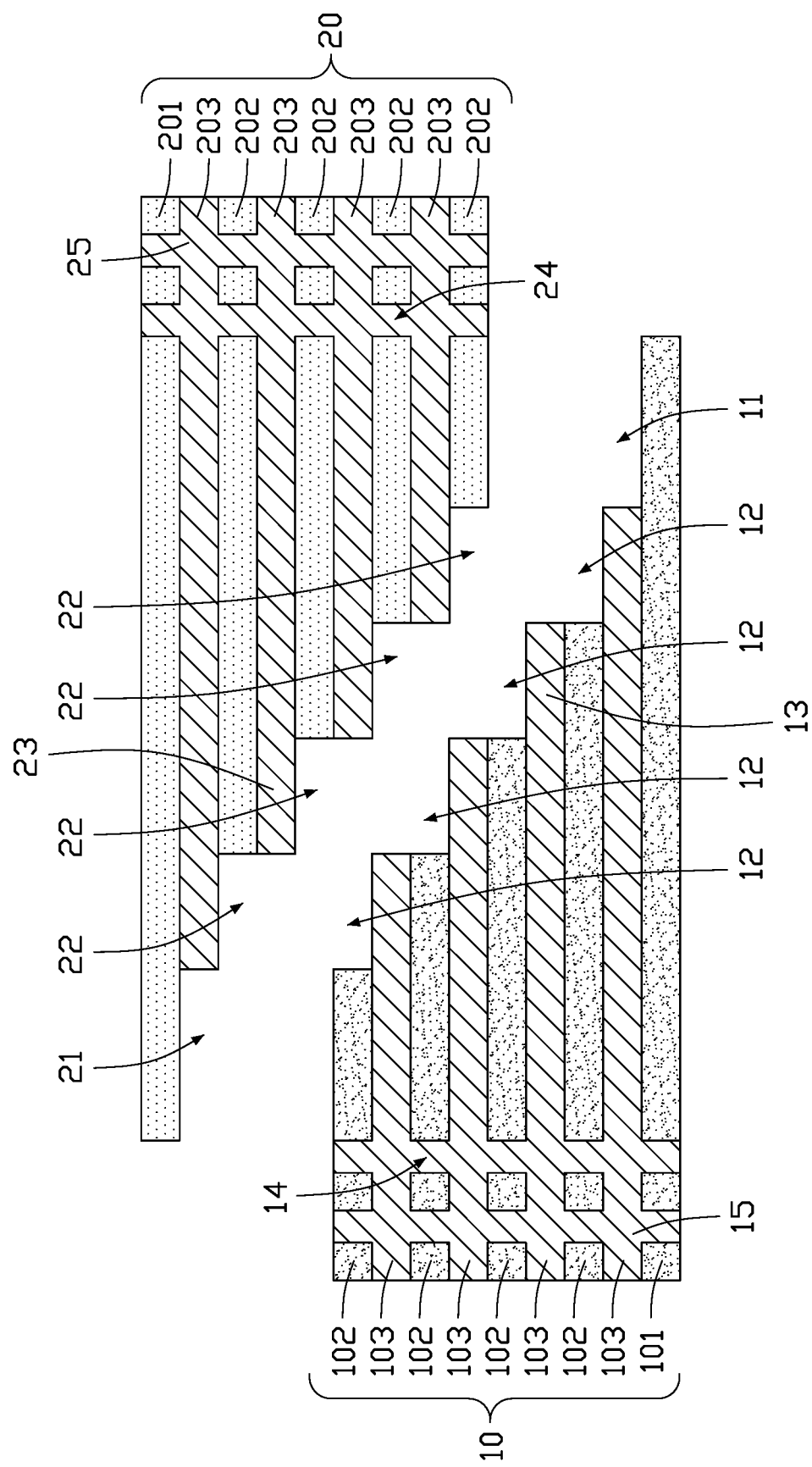
FIG. 1 is a diagrammatic view of an embodiment of a first circuit board and a second circuit board.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

Figure 6:
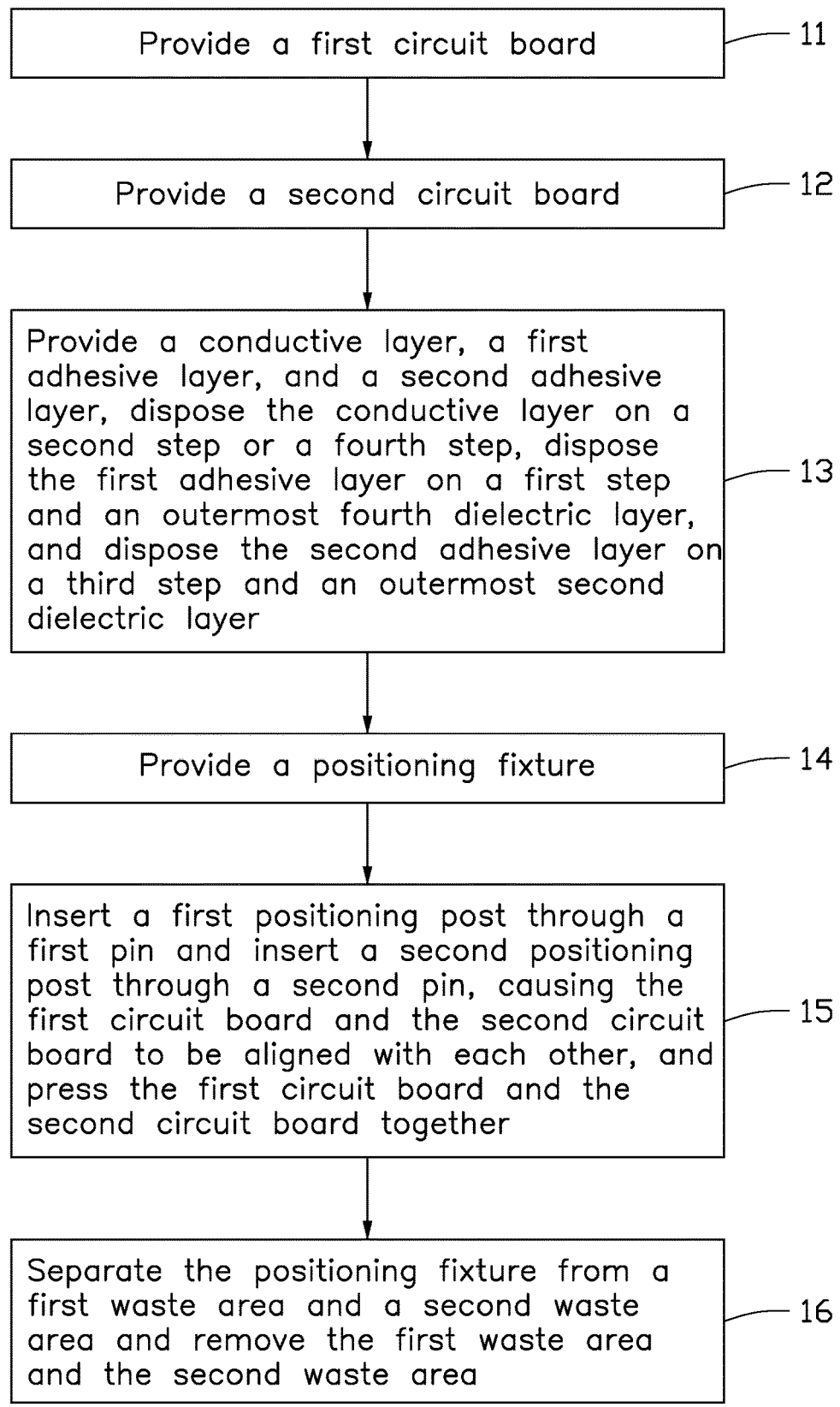
FIG. 6 is a flowchart of a method for manufacturing aboard-to-board connecting structure.

Referring to FIG. 6, a method for manufacturing a board-to-board connecting structure is presented in accordance with an embodiment. The method is provided by way of example, as there are a variety of ways to carry out the method. The method can begin at block 11.

At block 11, referring to FIG. 1, a first circuit board 10 is provided.

The first circuit board 10 may be a printed circuit board or a flexible circuit board. The first circuit board 10 includes a first dielectric layer 101 and a plurality of second dielectric layers 102 stacked on the first dielectric layer 101. A first wiring layer 103 is sandwiched between the first dielectric layer 101 and an adjacent second dielectric layer 102 and between two adjacent second dielectric layers 102. In one embodiment, four second dielectric layer 102 and four first wiring layers 103 are included. In other embodiments, the number of the second dielectric layers 102 and the number of the first wiring layers 103 can be changed as needed. In other embodiments, the number of the second dielectric layers 102 can be changed. For example, the number of the second dielectric layers 102 may be only one.

Each of the first dielectric layer 101 and the second dielectric layer 102 can be made of a material selected from epoxy resin, polypropylene (PP), BT resin, polyphenylene oxide (PPO), polyimide (PI), polyethylene terephthalate (PET), polyethylene naphthalate (PEN), and any combination thereof. In one embodiment, both the first dielectric layer 101 and the second dielectric layer 102 are made of a single material, such as polyimide. In other embodiments, each of the first dielectric layer 101 and the second dielectric layer 102 may be made of two or more materials as needed.

Along a stacking direction from the first dielectric layer 101 to the second dielectric layers 102, the first dielectric layer 101 protrudes with respect to the next first wiring layer 103 to form a first step 11. Each first wiring layer 103 protrudes with respect to the next second dielectric layer 102 to form a second step 12. Each first wiring layers 103 includes a first connection pad 13 corresponding to the second step 12. An end surface of the first connection pad 13 is aligned with an end surface of the previous second dielectric layer 102 at the second step 12.

In one embodiment, the first circuit board 10 includes a first waste area 14 away from the first step 11 and the second step 12. The first waste area 14 includes a portion of the first dielectric layer 101, a portion of each second dielectric layer 102, and a portion of each first wiring layer 103.

The first circuit board 10 further includes a plurality of first pins 15 along the stacking direction from the first dielectric layer 101 to the second dielectric layers 102. The first pin 15 can pass through the first waste area 14. In other embodiments, the first pin 15 may pass through another area of the first circuit board 10 besides the first waste area 14.

At block 12, a second circuit board 20 is provided.

The second circuit board 20 may be a printed circuit board or a flexible circuit board. The second circuit board 20 includes a third dielectric layer 201 and a plurality of fourth dielectric layers 202 stacked on the third dielectric layer 201. A second wiring layer 203 is sandwiched between the third dielectric layer 201 and an adjacent fourth dielectric layer 202 and between two adjacent fourth dielectric layers 202. In one embodiment, four fourth dielectric layer 202 and four second wiring layers 203 are included. In other embodiments, the number of the fourth dielectric layer 202 can be changed. For example, the number of the fourth dielectric layer 202 may be only one.

In one embodiment, the third dielectric layer 201 and the fourth dielectric layer 202 may be made of a material the same as or different from that of the first dielectric layer 101. Each of the third dielectric layer 201 and the fourth dielectric layer 202 may be made of one or at least two materials as needed.

Along a stacking direction of the third dielectric layer 201 to the fourth dielectric layers 202, the third dielectric layer 201 protrudes with respect to the next second wiring layer 203 to form a third step 21. Each second wiring layer 203 protrudes with respect to the next fourth dielectric layer to form a fourth step 22. Each second wiring layer 203 includes a second connection pad 23 corresponding to the fourth step 22. An end surface of the second connection pad 23 is aligned with an end surface of the previous fourth dielectric layer 202 at the fourth step 22.

In one embodiment, the second circuit board 20 includes a second waste area 24 away from the third step 21 and the fourth step 22. The second waste area 24 includes a portion of the third dielectric layer 201, a portion of each fourth dielectric layer 202, and a portion of each second wiring layer 203.

The second circuit board 20 further includes a plurality of second pins 25 along the stacking direction of the third dielectric layer 201 to the fourth dielectric layer 202. The second pin 25 can pass through the second waste area 24. In other embodiments, the second pin 25 may pass through another area of the second circuit board 20 besides the second waste area 24.

Figure 2:
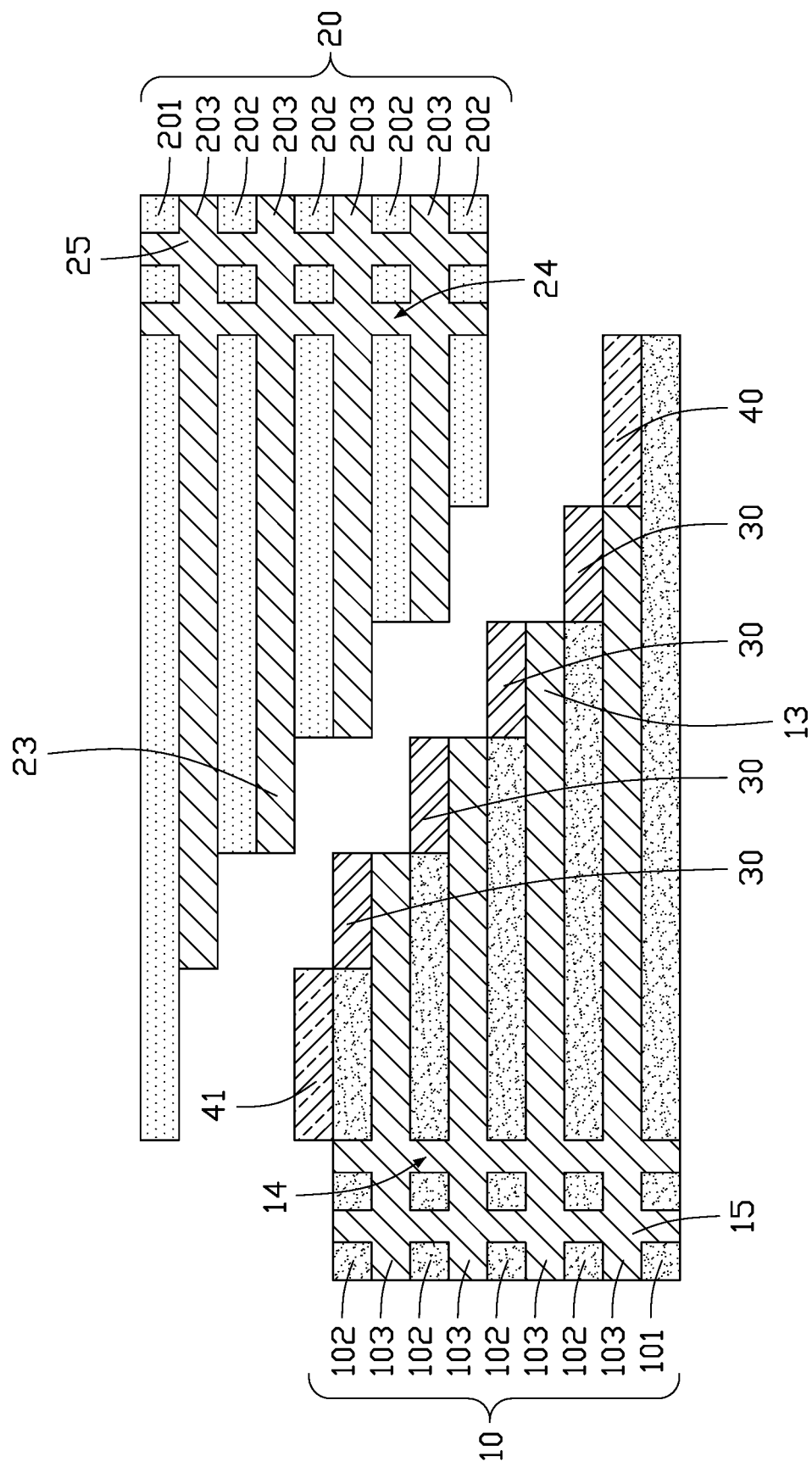
FIG. 2 is a diagrammatic view showing a conductive layer, a first adhesive layer, and a second adhesive layer disposed on the first circuit board of FIG. 1.

At block 13, referring to FIG. 2, a conductive layer 30, a first adhesive layer 40, and a second adhesive layer 41 are provided. The conductive layer 30 is disposed on the second step 12 or the fourth step 22. The first adhesive layer 40 is disposed on the first step 11 and the outermost fourth dielectric layer 202. The second adhesive layer 41 is disposed on the third step 21 and the outermost second dielectric layer 102.

The conductive layer 30 may be made of a conductive paste or a conductive glue. For example, the conductive paste may be made of a solder paste.

Figure 3:
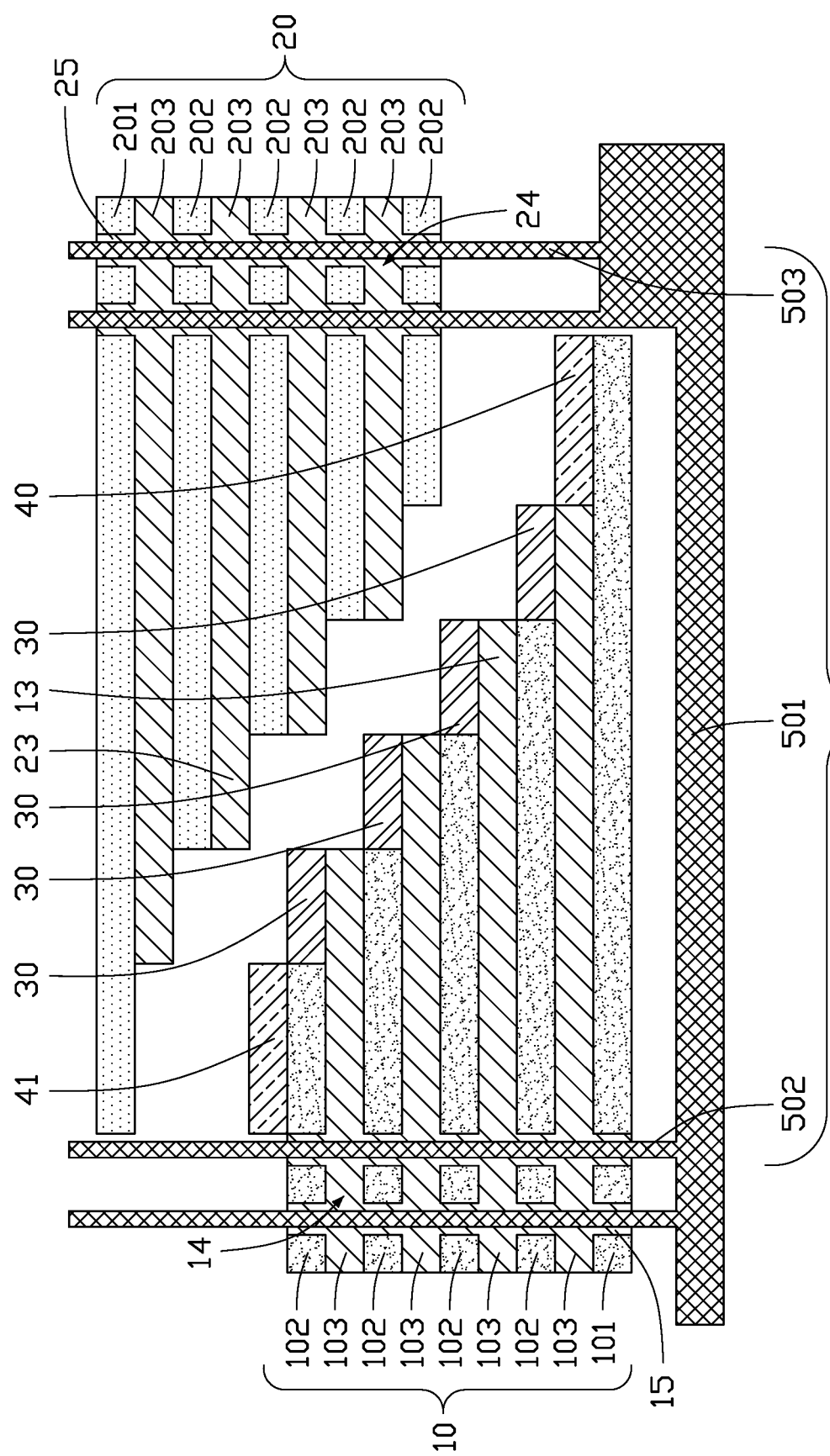
FIG. 3 is a diagrammatic view showing the first circuit board and the second circuit board of FIG. 2 aligned with each other through a positioning fixture.

At block 14, referring to FIG. 3, a positioning fixture 50 is provided. The positioning fixture 50 includes a base 501, and a first positioning post 502 and a second positioning post 503 mounted on a top surface of the base 501.

Figure 4:
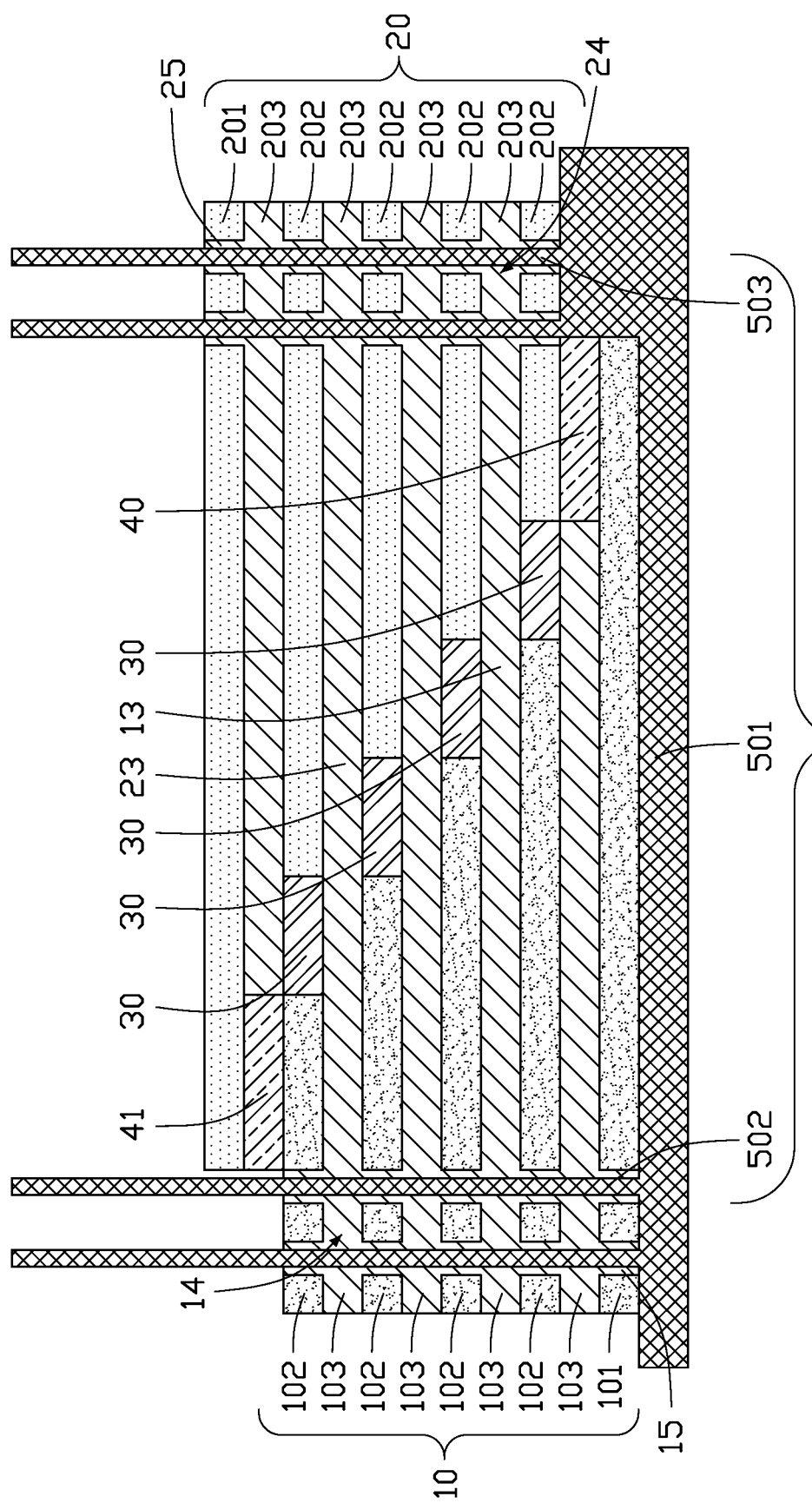
FIG. 4 is a diagrammatic view showing the first circuit board and the second circuit board of FIG. 3 pressed together.

At block 15, the first positioning post 502 is inserted through the first pin 15, and the second positioning post 503 is inserted through the second pin 25, causing the first circuit board 10 and the second circuit board 20 to be aligned with each other. Then, the first circuit board 10 and the second circuit board 20 are pressed towards the base 501 to be connected together. Referring to FIG. 4, the first step 11 and the outermost fourth dielectric layer 202 are bonded through the first adhesive layer 40. The third step 21 and the outer second dielectric layer 102 are bonded through the second adhesive layer 41. The second step 12 and the fourth step 22 are bonded through the conductive layer 30. Thus, the first connection pad 13 and the second connection pad 23 are electrically connected to each other through the conductive layer 30, thereby achieving electrical connection between the first circuit board 10 and the second circuit board 20.

Referring to FIG. 4, the top surface of the base 501 may be flat or have a concave and convex shape. The shape of the top surface can be changed according to flatness degree of the board-to-board connecting structure 100 (shown in FIG. 5) after the first circuit board 10 and the second circuit board 20 are pressed together.

Since the first adhesive layer 40 is bonded between the first dielectric layer 101 and the outermost fourth dielectric layer 202, the flatness of the first dielectric layer 101 can be improved (if the first adhesive layer 40 is omitted, the first dielectric layer 101 may be collapsed and attached onto the outermost fourth dielectric layer 202). Since the second adhesive layer 41 is bonded between the third dielectric layer 201 and the outermost second dielectric layer 102, the flatness of the third dielectric layer 201 can be improved (if the second adhesive layer 41 is omitted, the third dielectric layer 201 may be collapsed and attached onto the outermost second dielectric layer 102). Thus, the thickness evenness of the board-to-board structure 100 can be improved. Then, the board-to-board structure 100 can be easily bent.

In other embodiments, the first circuit board 10 and the second circuit board 20 can also be aligned with each other by optical alignment marks.

Figure 5:
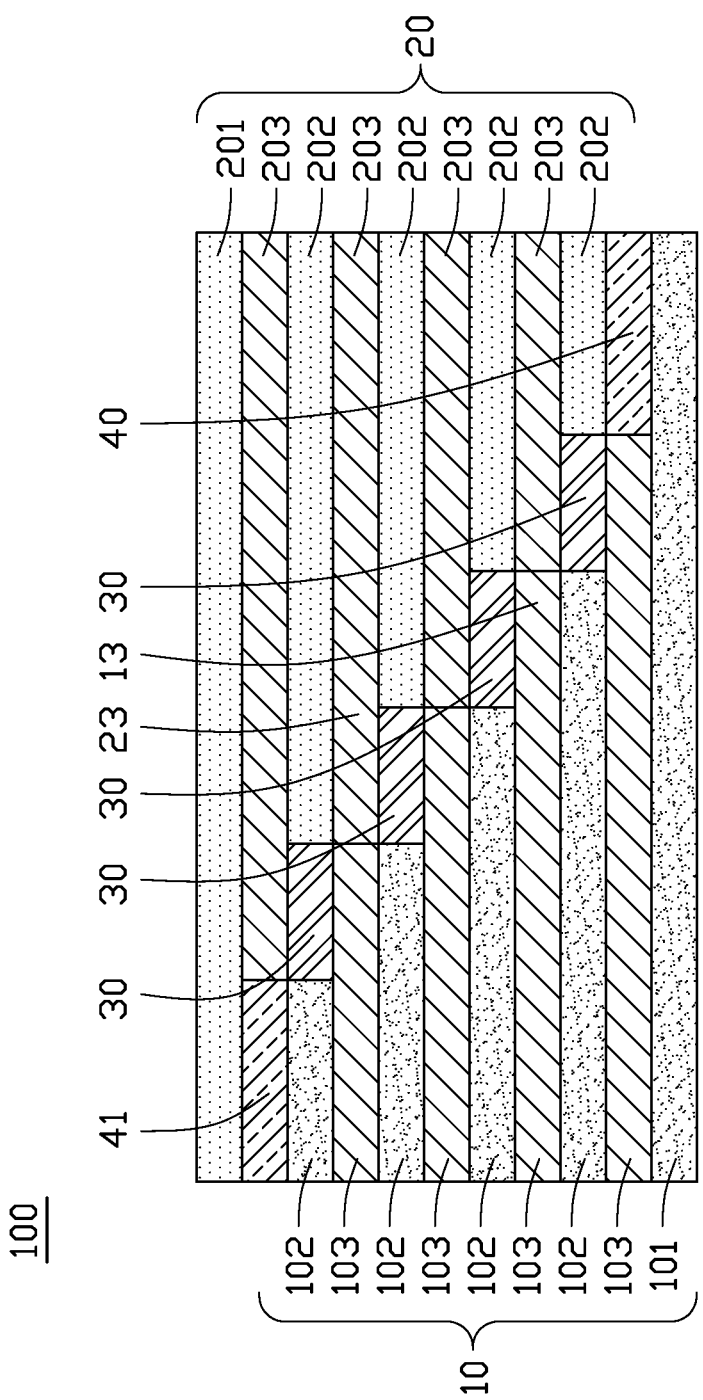
FIG. 5 is a diagrammatic view showing a first waste area of the first circuit board and a second waste area of the second circuit board of FIG. 4 removed to obtain a board-to-board connecting structure.

At block 16, referring to FIG. 5, the positioning fixture 50 is separated from the first waste area 14 and the second waste area 24. Then, the first waste area 14 and the second waste area 24 are removed, thereby obtaining the board-to-board connecting structure 100.

FIG. 5 illustrates an embodiment of a board-to-board connecting structure 100. The board-to-board connecting structure 100 includes a first circuit board 10, a second circuit board 20, a conductive layer 30, and a first adhesive layer 40, and a second adhesive layer 41.

The first circuit board 10 includes a first dielectric layer 101 and a plurality of second dielectric layers 102 stacked on the first dielectric layer 101. A first wiring layer 103 is sandwiched between the first dielectric layer 101 and an adjacent second dielectric layer 102 and between two adjacent second dielectric layers 102.

Along a stacking direction from the first dielectric layer 101 to the second dielectric layers 102, the first dielectric layer 101 protrudes with respect to the next first wiring layer 103 to form a first step 11. Each first wiring layer 103 protrudes with respect to the next second dielectric layer 102 to form a second step 12. Each first wiring layers 103 includes a first connection pad 13 corresponding to the second step 12. An end surface of the first connection pad 13 is aligned with an end surface of the previous second dielectric layer 102 at the second step 12.

The second circuit board 20 includes a third dielectric layer 201 and a plurality of fourth dielectric layers 202 stacked on the third dielectric layer 201. A second wiring layer 203 is sandwiched between the third dielectric layer 201 and an adjacent fourth dielectric layer 202 and between two adjacent fourth dielectric layers 202.

Along a stacking direction of the third dielectric layer 201 to the fourth dielectric layers 202, the third dielectric layer 201 protrudes with respect to the next second wiring layer 203 to form a third step 21. Each second wiring layer 203 protrudes with respect to the next fourth dielectric layer to form a fourth step 22. Each second wiring layer 203 includes a second connection pad 23 corresponding to the fourth step 22. An end surface of the second connection pad 23 is aligned with an end surface of the previous fourth dielectric layer 202 at the fourth step 22.

The second circuit board 20 is connected to the first circuit board 10. Referring to FIG. 4, the first step 11 and the outermost fourth dielectric layer 202 are bonded through the first adhesive layer 40. The third step 21 and the outer second dielectric layer 102 are bonded through the second adhesive layer 41. The second step 12 and the fourth step 22 are bonded through the conductive layer 30. Thus, the first connection pad 13 and the second connection pad 23 are electrically connected to each other through the conductive layer 30.

In addition, the present invention also improves the alignment accuracy of the first circuit board 10 and the second circuit board 20 through the positioning fixture 50, thereby improving the yield rate of the circuit board connecting structure 100.

Even though information and advantages of the present embodiments have been set forth in the foregoing description, together with details of the structures and functions of the present embodiments, the disclosure is illustrative only. Changes may be made in detail, especially in matters of shape, size, and arrangement of parts within the principles of the present embodiments to the full extent indicated by the plain meaning of the terms in which the appended claims are expressed.

What is claimed is:

1. A method for manufacturing a board-to-board connecting structure, comprising:
providing a first circuit board, the first circuit board comprising a first dielectric layer, a second dielectric layer stacked on the first dielectric layer, and a first wiring layer sandwiched between the first dielectric layer and the second dielectric layer, wherein along a stacking direction from the first dielectric layer to the second dielectric layer, the first dielectric layer protrudes with respect to the first wiring layer to form a first step, the first wiring layer protrudes with respect to the second dielectric layer to form a second step;
providing a second circuit board, the second circuit board comprising a third dielectric layer, a fourth dielectric layer stacked on the third dielectric layer, and a second wiring layer sandwiched between the third dielectric layer and the fourth dielectric layer, wherein along a stacking direction of the third dielectric layer to the fourth dielectric layer, the third dielectric layer protrudes with respect to the second wiring layer to form a third step, the second wiring layer protrudes with respect to the fourth dielectric layer to form a fourth step; and
bonding the first step and the fourth dielectric layer through a first adhesive layer, bonding the third step and the second dielectric layer through a second adhesive layer, and bonding the second step and the fourth step through a conductive layer, thereby connecting the first circuit board to the second circuit board to obtain the board-to-board structure.

2. The method of claim 1, wherein the first circuit board further comprises a first pin along the stacking direction from the first dielectric layer to the second dielectric layer, the second circuit board further comprises a second pin along the stacking direction from the third dielectric layer to the fourth dielectric layer, before connecting the first circuit board to the second circuit board, and the method further comprising:
providing a positioning fixture, the positioning fixture comprising a first positioning post and a second positioning post;
inserting the first positioning post through the first pin, inserting the second positioning post through the second pin, causing the first circuit board and the second circuit board to be aligned with each other; and
pressing the first circuit board and the second circuit board, causing the first circuit board and the second circuit board to be connected together.

3. The method of claim 2, wherein the first circuit board comprises a first waste area away from the first step and the second step, the first pin passes through the first waste area; the second circuit board comprises a second waste area away from the third step and the fourth step, the second pin passes through the second waste area.

4. The method of claim 3, wherein after connecting the first circuit board to the second circuit board, the method further comprising:
separating the positioning fixture from the first waste area and the second waste area;
removing the first waste area; and
removing the second waste area.

5. The method of claim 1, wherein the first wiring layer comprises a first connection pad corresponding to the second step, and an end surface of the first connection pad is flush with an end surface of the second dielectric layer; the second wiring layer comprises a second connection pad corresponding to the fourth step, an end surface of the second connection pad is flush with an end surface of the fourth dielectric layer;
wherein the first connection pad and the second connection pad are electrically connected to each other through the conductive layer.

6. The method of claim 1, wherein the conductive layer is made of conductive paste.

7. The method of claim 1, wherein at least two second dielectric layers are comprised in the first circuit board, the first wiring layer is further sandwiched between two adjacent second dielectric layers, along the stacking direction, each first wiring layer sandwiched between two adjacent second dielectric layers also protrudes with respect to a next second dielectric layer to form the second step;
at least two fourth dielectric layers are comprised in the second circuit board, the second wiring layer is further sandwiched between two adjacent fourth dielectric layers, along the stacking direction, each second wiring layer sandwiched between two adjacent fourth dielectric layers also protrudes with respect to a next fourth dielectric layer to form the fourth step.

8. A board-to-board connecting structure, comprising:
a first circuit board first circuit board comprising a first dielectric layer, a second dielectric layer stacked on the first dielectric layer, and a first wiring layer sandwiched between the first dielectric layer and the second dielectric layer, wherein along a stacking direction from the first dielectric layer to the second dielectric layer, the first dielectric layer protrudes with respect to the first wiring layer to form a first step, the first wiring layer protrudes with respect to the second dielectric layer to form a second step;
a second circuit board comprising a third dielectric layer, a fourth dielectric layer stacked on the third dielectric layer, and a second wiring layer sandwiched between the third dielectric layer and the fourth dielectric layer, wherein along a stacking direction of the third dielectric layer to the fourth dielectric layer, the third dielectric layer protrudes with respect to the second wiring layer to form a third step, the second wiring layer protrudes with respect to the fourth dielectric layer to form a fourth step;
a first adhesive layer for bonding the first step and the fourth dielectric layer;
a second adhesive layer for bonding the third step and the second dielectric layer; and
a conductive layer for bonding the second step and the fourth step.

9. The board-to-board connecting structure of claim 8, wherein the first wiring layer comprises a first connection pad corresponding to the second step, and an end surface of the first connection pad is flush with an end surface of the second dielectric layer; the second wiring layer comprises a second connection pad corresponding to the fourth step, an end surface of the second connection pad is flush with an end surface of the fourth dielectric layer;

wherein the first connection pad and the second connection pad are electrically connected to each other through the conductive layer.

10. The board-to-board connecting structure of claim 8, wherein the conductive layer is made of conductive paste.

11. The board-to-board connecting structure of claim 8, wherein at least two second dielectric layers are comprised in the first circuit board, the first wiring layer is further sandwiched between two adjacent second dielectric layers, along the stacking direction, each first wiring layer sandwiched between two adjacent second dielectric layers also protrudes with respect to a next second dielectric layer to form the second step;

at least two fourth dielectric layers are comprised in the second circuit board, the second wiring layer is further sandwiched between two adjacent fourth dielectric layers, along the stacking direction, each second wiring layer sandwiched between two adjacent fourth dielectric layers also protrudes with respect to a next fourth dielectric layer to form the fourth step.

* * * * *